(12) United States Patent
Emesh et al.

(10) Patent No.: US 6,818,604 B2
(45) Date of Patent: Nov. 16, 2004

(54) SYSTEM AND METHOD FOR CLEANING WORKPIECES

(75) Inventors: Ismail Emesh, Gilbert, AZ (US); Yakov Epshteyn, Phoenix, AZ (US); Periya Gopalan, Chandler, AZ (US); Guangshum Chen, Glendale, AZ (US); Xingbo Yang, Phoenix, AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 218 days.

(21) Appl. No.: 09/971,332

(22) Filed: Oct. 4, 2001

(65) Prior Publication Data

US 2003/0069150 A1 Apr. 10, 2003

(51) Int. Cl.⁷ .............................. C11D 7/32; C11D 7/06; C11D 7/08
(52) U.S. Cl. ....................... 510/176; 510/175; 510/178; 510/499
(58) Field of Search ................................ 510/175, 176, 510/178, 499

(56) References Cited

U.S. PATENT DOCUMENTS

| | | | |
|---|---|---|---|
| 5,108,513 A | | 4/1992 | Muller et al. |
| 5,311,634 A | | 5/1994 | Andros |
| 5,520,841 A | * | 5/1996 | Block et al. ........... 252/174.23 |
| 5,529,638 A | | 6/1996 | Lutz |
| 5,624,501 A | | 4/1997 | Gill, Jr. |
| 5,639,311 A | | 6/1997 | Holley et al. |
| 5,675,856 A | | 10/1997 | Itzkowitz |
| 5,698,040 A | | 12/1997 | Guldi et al. |
| 5,816,274 A | | 10/1998 | Bartram et al. |
| 5,846,335 A | * | 12/1998 | Maekawa et al. ............... 134/6 |
| 5,868,866 A | * | 2/1999 | Maekawa et al. ............. 134/34 |
| 5,875,507 A | | 3/1999 | Stephens et al. |
| 5,954,888 A | | 9/1999 | Gupta et al. |
| 6,006,391 A | | 12/1999 | Shurtliff et al. |
| 6,024,106 A | | 2/2000 | Yang et al. |
| 6,050,884 A | | 4/2000 | Togawa et al. |
| 6,182,323 B1 | | 2/2001 | Bahten |
| 6,361,611 B2 | * | 3/2002 | Jolley ............................ 134/2 |
| 6,508,258 B1 | * | 1/2003 | Lorimer ................... 134/102.1 |
| 6,589,357 B1 | * | 7/2003 | Wandres ........................ 134/6 |

* cited by examiner

*Primary Examiner*—Gregory R. Del Cotto
(74) *Attorney, Agent, or Firm*—Snell & Wilmer L.L.P.

(57) ABSTRACT

The invention relates generally to a system and method for improved cleaning of workpieces and workpiece cleaning tools. More specifically, the invention provides systems and methods for cleaning workpieces and sponges by manipulating the surface charge of one or more sponges by exposing them to various cleaning fluids. In one embodiment, sponges such as PVA sponges, having either positive, negative or neutral charges, are used to clean surfaces of workpieces such as semiconductor wafers. While cleaning a workpiece, a sponge may be exposed to a workpiece cleaning fluid, which may or may not alter the surface charge of the sponge. After cleaning the workpiece, the sponge may be exposed to a sponge cleaning fluid, which may or may not alter the surface charge of the sponge. Manipulating the surface charge of a sponge during and/or after cleaning of a workpiece may enhance cleaning of the workpiece, by attracting oppositely charged particles and/or repelling similarly charged particles from the workpiece surface. Manipulating the surface charge of a sponge may also enhance cleaning of the sponge, by reducing or eliminating the attractive forces between the surface of the sponge and the charged particles attached to it.

31 Claims, 5 Drawing Sheets

SYSTEM AND METHOD FOR CLEANING WORKPIECES

FIELD OF INVENTION

The present invention generally relates to systems and methods for cleaning workpieces. More specifically, the present invention relates to systems and methods for manipulating surface charges of cleaning tools, such as sponges, for improved cleaning of workpieces and of the cleaning tools.

BACKGROUND OF THE INVENTION

Many manufacturing industries require systems for cleaning workpieces with highly polished surfaces. For example, workpieces such as semiconductor wafers, memory disks, compact disks, optical blanks, flat panel displays, read write heads and the like require thorough post-production cleaning. Often, this cleaning requires the removal of tiny particles, such as sub-micron and sub-half-micron sized particles, from a surface. Failure to thoroughly remove such particles typically results in a low yield of usable product, especially in the semiconductor industry. Illustrative examples, below, will refer specifically to the use of this invention in connection with the processing of semiconductor wafers, but such examples are presented merely to aid in understanding, and are not intended to limit in any way the generality or application of the invention.

During its fabrication, a workpiece may be subjected to various processing steps. For example, fabricating a semiconductor wafer typically involves the growth or deposition of insulating layers, the deposition of metal or other conductive layers, impurity doping, photolithographic patterning, planarization and the like. Successful fabrication of semiconductor wafers, like the fabrication of many other types of workpieces, requires extreme cleanliness of the wafers at various stages of the process. Thus, fabrication steps are often preceded and/or followed by cleaning steps.

One step in fabricating a semiconductor wafer involves planarization, such as chemical-mechanical planarization ("CMP"). After CMP, wafers are typically cleaned by a process of scrubbing with a cleaning pad, sponge or brush, to remove particulates, residue, and contaminants remaining on the surface of the wafer. A pad, typically in the form of a flat, circular pad, or a brush, typically in the form of a cylindrical roller, is often made of a spongy material such as polyvinyl acetate ("PVA") or similar material. Pads or brushes may have bumps, ridges, or other projections on their surfaces, and may take any form convenient for aiding in the cleaning process. For the purposes of this specification, all such pads, sponges and brushes, whatever their shape or configuration, will be referred to as "sponges."

Post-CMP cleaning of semiconductor wafers is often accomplished by scrubbing the wafers with PVA sponges while adding a cleaning fluid, such as ammonium hydroxide solution or de-ionized ("DI") water. Mechanical scrubbing with sponges works well for removing larger particles from the surface of a wafer, but is far less effective at cleaning ultra-fine particles, such as sub-micron and sub-half-micron sized particles. Such microscopic particles often cling to microscopic irregularities in the highly-polished surface of a wafer. Since these ultra-fine particles often possess an electric charge, they may also adhere to a wafer via electrostatic, Van der Waals forces. Conventional cleaning methods, which typically rely on mechanical forces to clean a wafer, often fail to remove these small, charged particles, thus resulting in a decreased yield on the wafer and a decreased value of the wafer.

After sponges are used to scrub a wafer, especially following CMP, particles often accumulate on, or are embedded into, the surface of the sponges. For example, conventional sponges typically have a slightly negative surface charge over a wide range of pH, so the surfaces of these sponges often accumulate positively charged, residual particles from the wafer surface. If not removed, these particles may damage the surfaces of subsequent wafers when the same sponges are used again for scrubbing. Semiconductor wafers are processed to fabricate devices having extremely fine detail. Thus, any scratching of a wafer can cause a device to fail, resulting in a decreased yield on the wafer. Conventional systems and methods for cleaning sponges typically involve washing the sponges with a cleaning fluid while oscillating or otherwise mechanically cleaning the brushes. These methods often fail to remove the small, charged particles described above. As residual particles accumulate on a sponge's surface, the ability of the sponge to effectively clean wafers decreases. When a sponge becomes sufficiently saturated with particles, it no longer functions properly and must be discarded and replaced.

Thus, a need exists for systems and methods for effectively cleaning the highly-polished surfaces of semiconductor wafers and other workpieces. A need also exists for systems and methods for effectively cleaning sponges used to clean workpieces.

SUMMARY OF THE INVENTION

The present invention meets the aforementioned needs by providing systems and methods for cleaning workpieces and workpiece cleaning tools, such as sponges. In one embodiment, a system includes one or more workpiece cleaning stations. A workpiece cleaning station may include one or more sponges, a workpiece cleaning fluid, a sponge cleaning fluid and a fluid delivery system. Sponges may have positive, negative or neutral surface charges. Workpiece cleaning fluids and/or sponge cleaning fluids may be configured to alter the surface charges of one or more sponges. For example, a cleaning fluid may contain a sponge charge modifying agent, such as an aliphatic or aromatic amine. By manipulating the surface charge of one or more sponges, either during workpiece cleaning, during sponge cleaning or both, the systems and methods of the present invention provide more efficient cleaning of workpieces and of sponges.

According to one aspect of the invention, a method for cleaning workpieces and sponges is provided. In one embodiment, a workpiece may be cleaned with one or more sponges and a cleaning fluid and then removed from the sponges. After cleaning a workpiece, one or more sponges may be exposed to a sponge cleaning fluid, either in the same location or in a separate sponge cleaning apparatus. Either the workpiece cleaning fluid, the sponge cleaning fluid or both may be configured to alter the surface charge of one or more sponges. Thus, the surface charge of a sponge may be manipulated to more effectively attract or repel charged particles from the surface of a workpiece. The surface charge of a sponge may also be manipulated to more easily remove charged particles from its surface during sponge cleaning.

BRIEF DESCRIPTION OF THE DRAWINGS

Additional aspects of the present invention will become evident upon reviewing the non-limiting embodiments described in the specification and the claims taken in conjunction with the accompanying figures, wherein like numerals designate like elements, and:

DETAILED DESCRIPTION

The following descriptions are of exemplary embodiments of the invention only, and are not intended to limit the scope, applicability, or configuration of the invention in any way. Rather, the following description is intended to provide convenient illustrations for implementing different embodiments of the invention. As will become apparent, various changes may be made in the function and arrangement of the elements described in these embodiments without departing from the spirit and scope of the invention. For example, various changes may be made in the design and arrangement of the elements described in the preferred embodiments, without departing from the scope of the invention as set forth in the appended claims.

Figure 1:
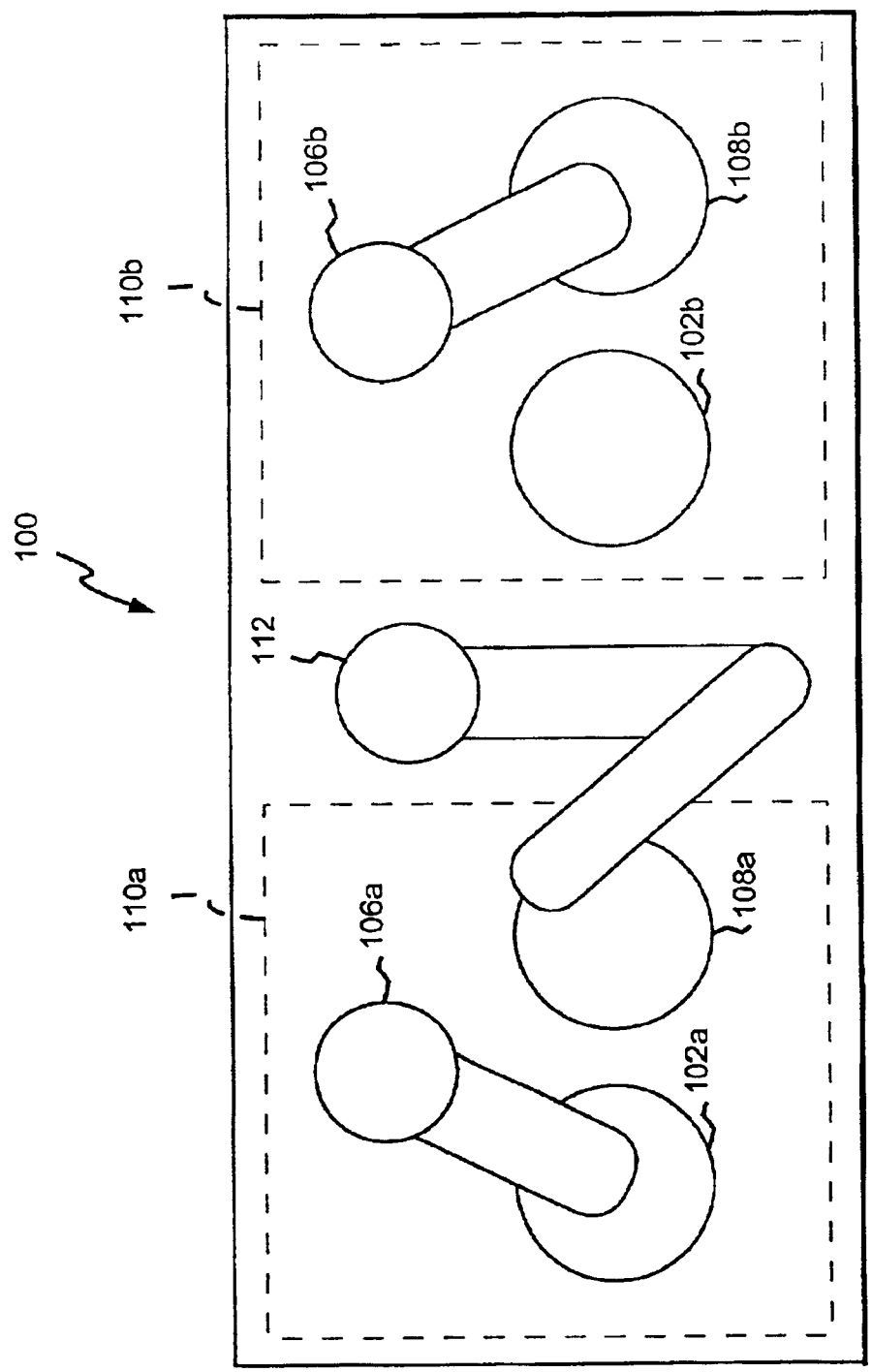
FIG. 1 is a top view of an exemplary system for cleaning workpieces and sponges, including a stationary robot.

In accordance with various aspects of the present invention, systems and methods for improved cleaning of workpieces and sponges are provided. In one embodiment of the invention, and with reference to FIG. 1, a workpiece cleaning system 100 includes two cleaning stations 110, each of which include a workpiece cleaning apparatus 102, a sponge cleaning apparatus 108 and a support stand 106.

Various other embodiments of the invention may include similar systems with different configurations or combinations of elements. For example, another embodiment of workpiece cleaning system 100 may include only one cleaning station 110. In another embodiment, cleaning system 100 may include three or more cleaning stations 110. In another embodiment, workpiece cleaning apparatus 102 and sponge cleaning apparatus 108 may be combined such that support stand 106 may be eliminated from the combination. For example, if two or more cylindrical sponges are used in workpiece cleaning apparatus 102, it may be advantageous to clean the sponges by applying cleaning fluids to them in the same location in which they cleaned the workpieces—i.e., without moving the sponges to a separate sponge cleaning apparatus 108. (Such an embodiment is described in further detail below with reference to FIG. 4). In yet another embodiment, sponge cleaning stations 108 may be a separate component of workpiece cleaning system 100 which may be used completely apart from cleaning stations 110 or which may be removably attachable to cleaning stations 110.

As mentioned above, for the purposes of this specification, "sponge" may be any sponge, brush, pad or other device suitable for cleaning a workpiece. A sponge may have a flat, cylindrical or any other suitable configuration and may be constructed from PVA, a material similar to PVA or any other suitable material. In general, any suitable configuration or combination of cleaning stations 110, workpiece cleaning apparatus 102, sponge cleaning apparatus 108, support stands 106 and/or sponges may be included in cleaning system 100, without departing from the scope of the invention.

In accordance with one aspect of the invention, cleaning system 100 may also include one or more robots 112. Robot 112 may be configured to retrieve a workpiece (not shown) onto or within one or more cleaning stations 110 and/or to transfer a workpiece from one cleaning station 110 to another. In one embodiment, a workpiece may be placed in a first cleaning station 110a by a human or a device (not shown) separate from cleaning system 100 and robot 112 may be configured to retrieve the workpiece from first cleaning station 110a and transfer the workpiece to a second cleaning station 110b. Another separate device (not shown) may then retrieve the workpiece from second cleaning station 110b and transfer it out of cleaning system 100.

In general, any configuration or combination of robots 112 or other suitable devices may be used to deliver and transfer workpieces to and from one or more cleaning stations 110. In one exemplary embodiment, for example, workpieces may be moved from one cleaning station 110 to another via a track using pressurized aqueous media for propulsion. Such a device for transporting workpieces is described in U.S. Pat. No. 5,108,513, the entire contents of which is hereby incorporated by reference. Alternatively, workpieces and sponges may be transferred in any other suitable manner, such as by one or more robots 112.

Figure 2:
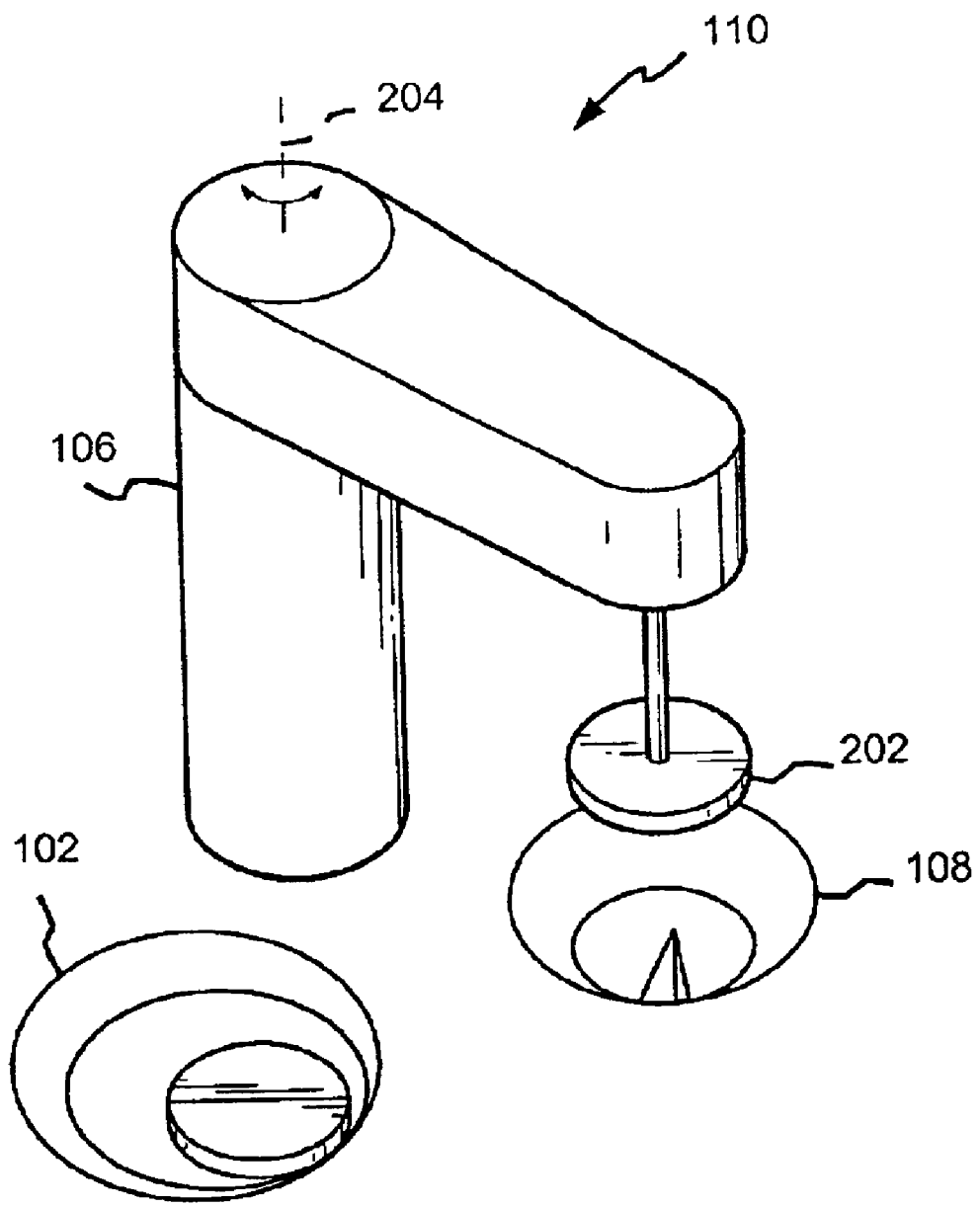
FIG. 2. is a perspective view of an exemplary embodiment of a workpiece cleaning station.

FIG. 2 illustrates, in perspective view, one exemplary embodiment of cleaning station 110. As described above, cleaning station 110 may include workpiece cleaning apparatus 102, sponge cleaning apparatus 108 and support stand 106. Workpiece cleaning apparatus 102 and sponge cleaning apparatus 108 may be located on or recessed into a surface. Support stand 106 may hold and control the motion of an upper sponge 202. Support stand 106 may be configured to pivot about an axis 204 to position upper sponge 202 over workpiece cleaning apparatus 102 or sponge cleaning apparatus 108. Support stand may also be configured to position upper sponge 202 in contact with the upper surface of a workpiece (not shown) and to spin or otherwise move upper sponge 202 to mechanically scrub the workpiece. Support stand 106 may then position upper sponge 202 within sponge cleaning apparatus 108 for cleaning. Cleaning stations 110 or similar apparatus, such as depicted in FIG. 2 and described above, are well known to those skilled in the art. Any other apparatus for cleaning workpieces and/or sponges, either currently available or developed in the future, may be incorporated into workpiece cleaning system 100 without changing the scope of the present invention.

Figure 3:
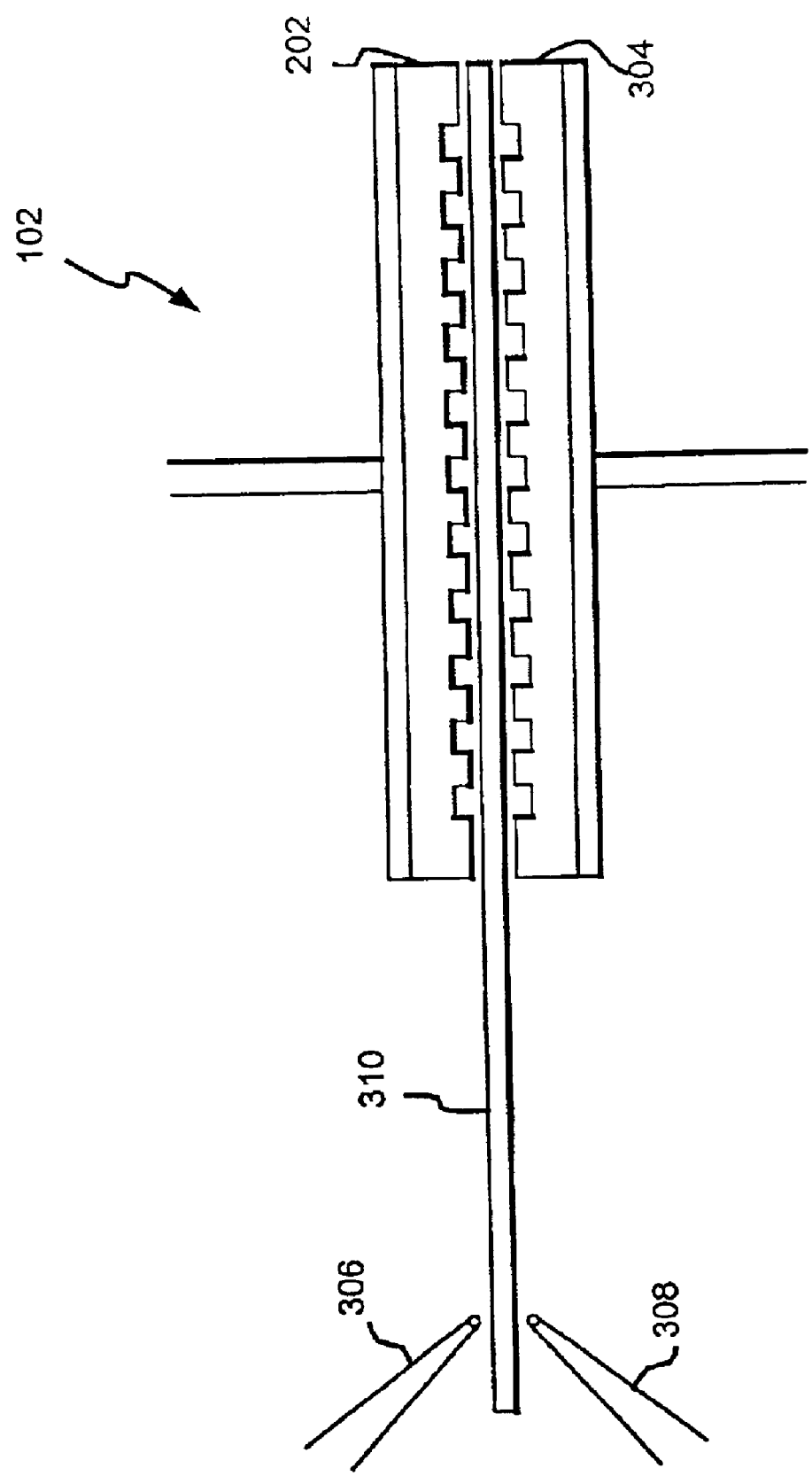
FIG. 3 is a side view of an exemplary workpiece cleaning apparatus.

In one embodiment of the present invention, and with reference to FIG. 3, workpiece cleaning apparatus 102 may include upper sponge 202, a lower sponge 304 and spray cleaning nozzles 306 and 308. (FIG. 3 also illustrates a workpiece 310 in position for cleaning). As mentioned above, sponges 202 and 304 may have any configuration suitable for cleaning workpiece 310. Thus, although FIG. 3 shows a workpiece cleaning apparatus 102 with two, flat, disk-shaped sponges 202 and 304, other workpiece cleaning apparatus 102 may include more than two sponges, cylindrical sponges, or any other combination or configuration of sponges for cleaning a workpiece 310. Apparatus for cleaning workpieces are well known in the art. For example, semiconductor wafer cleaning devices are described in U.S. Pat. Nos. 5,624,501, 5,675,856 and 5,875,507, the entire contents of which are hereby incorporated by reference. Any suitable apparatus for cleaning workpieces, such as illustrated in FIG. 3 and described above, including currently available apparatus and any apparatus discovered in the future, may be incorporated into workpiece cleaning system 100 without changing the scope of the invention.

In the embodiment of workpiece cleaning apparatus 102 depicted in FIG. 3, cleaning fluid may be deposited, sprayed or otherwise delivered on workpiece 310 and sponges 202 and 304 by nozzles 306 and 308. Upper sponge 202 and lower sponge 304 may be made to spin on their axes or otherwise move about workpiece 310, thus cleaning workpiece.

Figure 4:
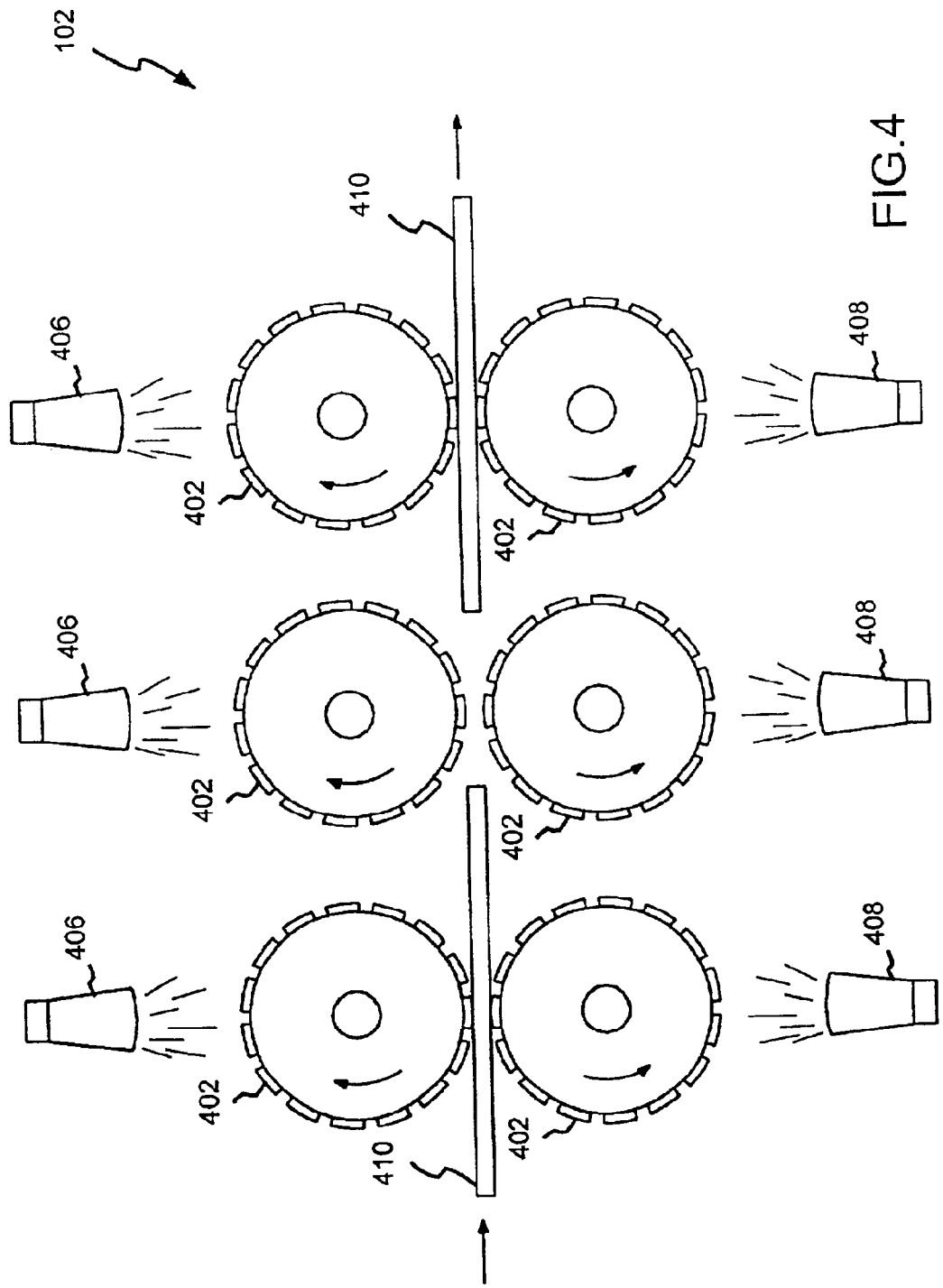
FIG. 4 is side view of another exemplary workpiece cleaning apparatus.

In accordance with another embodiment of the present invention, and with reference to FIG. 4, workpiece cleaning apparatus 102 may comprise one or more cylindrical sponges 402. In such an embodiment, workpieces 410 may be cleaned while traveling between two sets of adjacent sponges 402. One or more fluid delivery systems 406 and 408, such as nozzles or sprayers, may deliver workpiece cleaning fluid and/or sponge cleaning fluid to workpiece cleaning apparatus 102. In accordance with another aspect of the present invention, sponges 402 may remain in the same location during cleaning of workpieces 410 and cleaning of sponges 410. In an alternative embodiment, as described above with reference to FIG. 2, sponges 202 may be moved from workpiece cleaning apparatus 102 to sponge cleaning apparatus 108.

Figure 5:
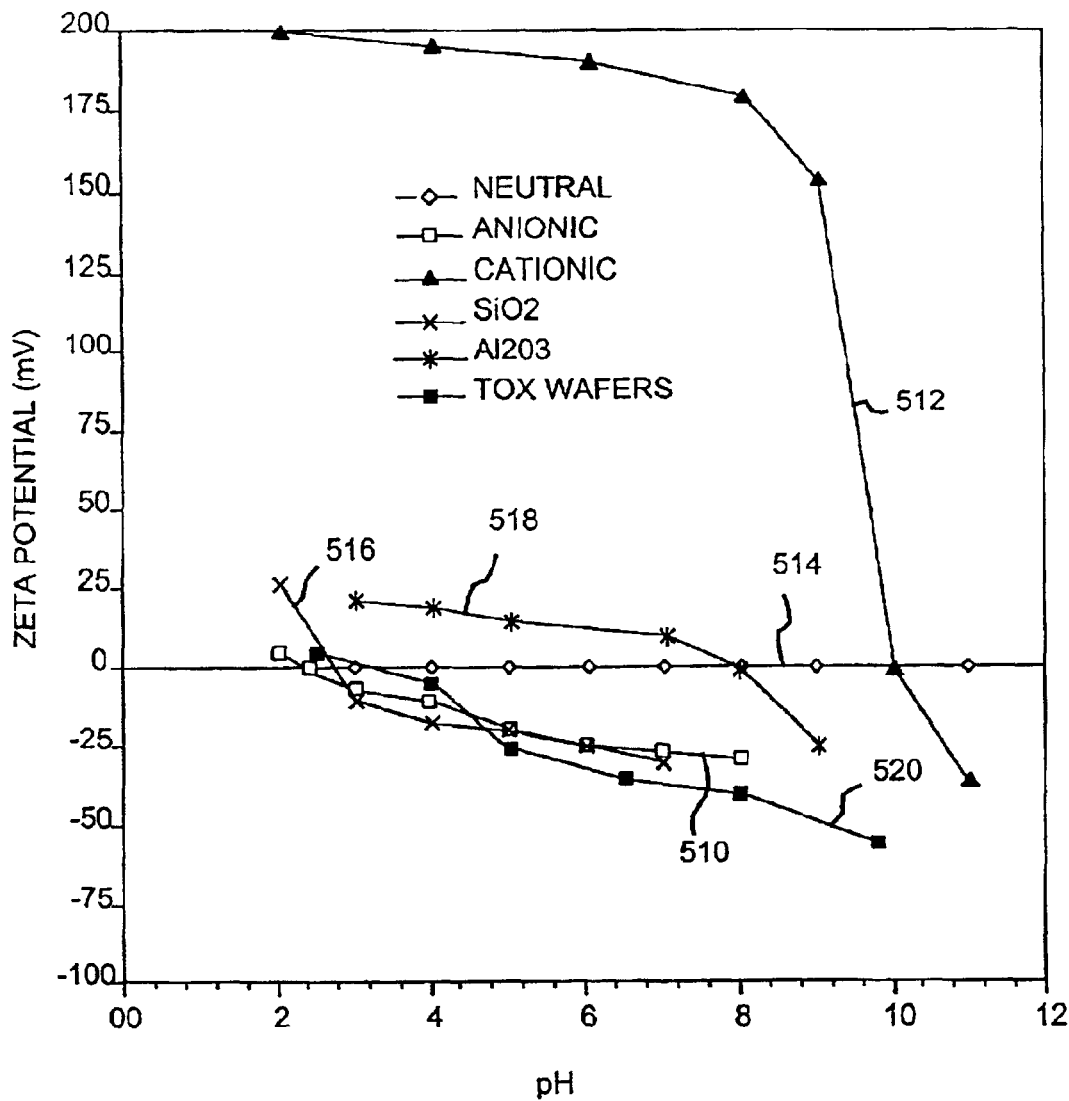
FIG. 5 is a graph showing the surface charges of various sponges and particles at various pH levels.

In accordance with one aspect of the present invention, sponges 202, 304 and/or 402 may be configured to possess particular surface charges within particular pH environments. FIG. 5 illustrates surface charges (or "zeta potentials"), at various pH levels, of several exemplary sponges and of several particles (e.g., SiO2 516 and Al2O3 518) which may be found on workpieces such as semiconductor wafers (e.g., TOX wafers 520). For example, sponges such as conventional PVA sponges typically have slightly negative surface charges at most pH levels used for cleaning semiconductor wafers. Thus, conventional sponges may be referred to as "anionic" sponges 510. As illustrated in FIG. 5, anionic sponges 510 may have surface charges of approximately −7 mV at pH 3 and approximately −25 mV at pH 8.

Alternatively, sponges 202, 304 and 402 may be configured to have positive surface charges ("cationic sponges" 512) or neutral surface charges ("neutral sponges" 514) over various pH ranges. For example, cationic sponges 512 may be configured to have surface charges of +200 mV at pH 2, slightly less positive surface charges from pH 2 through pH 9, neutral charge at pH 10 and negative surface charges at pH greater than 10.

In one embodiment of the present invention, the pH environment of one or more sponges 202, 304 and 402 may be controlled and/or modified by a workpiece cleaning fluid, a sponge cleaning fluid or both. Examples of cleaning fluids often used to clean workpieces and/or sponges include, but are not limited to, DI water, dilute ammonium hydroxide, dilute hydrofluoric acid, buffered hydrofluoric acid, solvents, surfactants, detergents and the like. For example, a solution of approximately 2% ammonium hydroxide will have a pH of approximately 11. Cleaning fluid may be applied to sponges 202, 304 and 402 during cleaning of a workpiece in workpiece cleaning apparatus 102 and/or during cleaning of sponges 202, 304 and 402 in sponge cleaning apparatus 108. In one embodiment, cleaning fluid used in workpiece cleaning apparatus 102 may be the same as cleaning fluid used in sponge cleaning apparatus 108. In another embodiment, cleaning fluids may be different the two apparatus 102 and 108.

Sponges with surface charges will attract particles with opposite surface charges or repel particles with similar surface charges, via electrostatic forces, from surfaces being cleaned. For example, negatively charged sponges may attract various positively charged particles and repel various negatively charged particles, positively charged sponges may attract various negatively charged particles and repel various positively charged particles, and the like. Thus, sponges may accumulate various oppositely-charged particles on their surfaces. If those sponges are then exposed to cleaning fluid which changes the pH environment and, thus, reverses the surface charge of sponges, particles on the surface of sponges may no longer adhere to the surface and may fall off, rendering clean sponges. For example, and with reference again to FIG. 5, if cationic sponge 512 accumulates negatively charged particles on its surface while cleaning semiconductor wafers, the surface charge of cationic sponge 512 may be changed to a negative charge in sponge cleaning apparatus by exposing cationic sponge to approximately 2% ammonium hydroxide solution at pH 11. When cationic sponge 512 acquires a negative charge at pH 11, many negatively charged particles will no longer be attracted to its surface and will fall off or be easily washed off in sponge cleaning apparatus 108.

In another embodiment of the present invention, one or more cleaning fluids may include a sponge charge modifying agent which is configured to modify the surface charge of one or more sponges. For example, a sponge charge modifying agent may be added to a workpiece cleaning fluid, a sponge cleaning fluid or both. Examples of sponge charge modifying agents include, but are not limited to, aliphatic amines or an aromatic amines.

Sponge cleaning apparatus 108 may comprise any suitable device for cleaning one or more sponges used in workpiece cleaning. Sponge cleaning apparatus 108 may include a bath-like apparatus, in which sponges may soak. Sponge cleaning apparatus 108 may also include a mechanism for oscillating or otherwise moving or shaking sponges to remove particles and other debris. In another embodiment of the invention, sponge cleaning apparatus 108 may be physically separate from workpiece cleaning system 100. For example, sponge cleaning apparatus 108 may be a separate bath-like apparatus, basin or the like which is freestanding, removably attachable or otherwise separate from workpiece cleaning system. In another embodiment, support stand 106 may be configured to turn a sponge circularly or in another pattern within sponge cleaning apparatus 108 such that the sponge will brush against or over a protrusion in sponge cleaning apparatus 108, effectively acting as a "beating bar" to remove particles from the sponge. Any suitable configuration for sponge cleaning apparatus 108 may be incorporated into workpiece cleaning system 100 without departing from the scope of the present invention.

Just as any suitable combination and configuration of workpiece cleaning apparatus, sponge cleaning apparatus 108, support stand 106 and/or robots 112 may be included in workpiece cleaning system 100, so to can any combination of sponges and cleaning fluids be included in workpiece cleaning system 100. Thus, a combination of sponges and cleaning fluid may be configured to give sponges a particular surface charge at one workpiece cleaning station 102a, to remove particles with a particular charge. The surface charge of those sponges may then be reversed in sponge cleaning apparatus 108a to more effectively clean sponges. A different combination of sponges (not shown) and cleaning fluid may be used in another workpiece cleaning station 102b, to remove particles with different charges. The surface charges of those sponges may then be reversed in sponge cleaning station 108b to more effectively remove the charged particles. Any suitable combination of sponges and cleaning fluid may be used, without departing from the scope of the present invention.

With reference again to FIG. 1, according to one embodiment of the present invention, a method for cleaning a workpiece includes introducing the workpiece into workpiece cleaning system 100. The workpiece may arrive at a first workpiece cleaning apparatus 102a, where it may be cleaned by one or more sponges having a particular surface charge. After being cleaned at first workpiece cleaning apparatus 102a, the workpiece may be transferred, by robot 112, aqueous track or other methods, to second workpiece cleaning apparatus 102b, for further cleaning. Second workpiece cleaning apparatus 102b may include one or more sponges with a particular surface charge. After being cleaned at second workpiece cleaning apparatus 102b, workpiece may be transferred out of workpiece cleaning system 100. When sponges are not cleaning workpieces, they may be cleaned in sponge cleaning apparatus 108. One or more workpiece cleaning fluids may change the surface charges of one or more sponges, enabling more efficient cleaning of workpieces. One or more cleaning fluids may change the surface charges of one or more sponges, causing particles which were formerly attracted to the surfaces of the sponges by electrostatic forces to more easily fall off or be washed off in sponge cleaning apparatus.

For example, and for exemplary purposes only, first workpiece cleaning apparatus 102a may use anionic sponges (not shown) and workpiece cleaning fluid of approximately 2% ammonium hydroxide solution (pH about 11) to clean a semiconductor wafer after CMP. Anionic sponges may then be cleaned in first sponge cleaning station 108a, with a sponge cleaning fluid of approximately 2% ammonium hydroxide solution. After this initial cleaning, the workpiece may be transferred via robot 112 to second workpiece cleaning apparatus 102b. Second workpiece cleaning apparatus 102b may use cationic sponges (also not shown) with a workpiece cleaning fluid containing a sponge charge modifying agent such as polyethylamine (an aliphatic amine). Such a fluid may have a pH of approximately 8. At pH 8, cationic brushes may have a positive charge and, thus, attract negatively charged particles and repel positively charged particles from the surface of the workpiece. Cationic sponges may then be cleaned in second sponge cleaning apparatus, with approximately 2% ammonium hydroxide solution as the sponge cleaning fluid. At pH approximately 11, caused by the ammonium hydroxide solution, the cationic brushes may acquire a negative charge and, thus, negatively charged particles formerly adhering to the surface of the sponges may no longer be attracted to their surfaces and may easily fall off or be easily washed off.

The above described systems and methods for cleaning workpiece and for cleaning sponges, using variations in sponge surface charges and cleaning fluids, achieve the desired results of more effectively cleaning workpieces and more effectively cleaning sponges. The overall result is a higher yield on workpieces such as semiconductor wafers and sponges that have longer longevity and work more effectively.

Lastly, as mentioned above, various principles of the invention have been described only as illustrative embodiments, and many combinations and modifications of the above-described structures, arrangements, proportions, elements, materials and components may be used in the practice of the invention. For example, methods and apparatuses not specifically described may be varied and particularly adapted for a specific environment and operating requirement without departing from those principles.

What is claimed is:

1. A system for cleaning workpieces and sponges, the system comprising:
   one or more cleaning stations, each comprising;
      one or more polyvinyl acetate sponges having a surface charge and configured for cleaning said workpieces,
      a fluid delivery system,
      a workpiece cleaning fluid having a sponge charge modifying agent, and
      a sponge cleaning fluid, wherein at least one of said workpiece cleaning fluid and said sponge cleaning fluid comprise a sponge charge modifying agent configured to change the surface charge of said one or more sponges.

2. The system of claim 1, wherein said surface charge is taken from the group consisting of positive, negative and neutral.

3. The system of claim 1, wherein said workpiece cleaning fluid is configured to change said surface charge of said one or more sponges when said one or more sponges are exposed to said workpiece cleaning fluid.

4. The system of claim 1, wherein said workpiece cleaning fluid contains a sponge charge modifying agent.

5. The system of claim 4, wherein said sponge charge modifying agent is an aliphatic amine.

6. The system of claim 4, wherein said sponge charge modifying agent is an aromatic amine.

7. The system of claim 1, wherein said sponge cleaning fluid is configured to change said surface charge of said one or more sponges when said one or more sponges are exposed to said sponge cleaning fluid.

8. The system of claim 1, wherein said sponge cleaning fluid contains a sponge charge modifying agent.

9. The system of claim 8, wherein said sponge charge modifying agent is an aliphatic amine.

10. The system of claim 8, wherein said sponge charge modifying agent is an aromatic amine.

11. The system of claim 1, wherein said fluid delivery system comprises at least one nozzle or sprayer.

12. The system of claim 1 wherein said fluid delivery system comprises at least one nozzle or sprayer and at least one container.

13. The system of claim 12, wherein said at least one container is configured to contain said one or more sponges and said sponge cleaning fluid.

14. The system of claim 12, wherein said at least one container is physically separate from said one or more cleaning stations.

15. The system of claim 12, wherein said container is removably connected to said one or more cleaning stations.

16. The system of claim 1, wherein said cleaning station further comprises a sponge cleaning apparatus configured for cleaning said one or more sponges.

17. The system of claim 16, wherein said cleaning station further comprises a support stand configured to detachably hold at least one of said one or more sponges, to suitably position said at least one of said one or more sponges in a position for cleaning a workpiece and to move said at least one of said one or more sponges to a suitable position within said sponge cleaning apparatus for cleaning said at least one of said one or more sponges.

18. The system of claim 1, wherein said workpiece cleaning fluid and said sponge cleaning fluid are each independently taken from the group consisting of deionized water, dilute ammonium hydroxide, dilute hydrofluoric acid, buffered hydrofluoric acid, solvents, surfactants and detergents.

19. The system of claim 1, further comprising a transferring apparatus for transferring said workpieces between two or more of said one or more cleaning stations.

20. The system of claim 19, wherein said transferring apparatus comprises one or more robots.

21. The system of claim 20, wherein said transferring apparatus comprises one or more tracks configured to guide said workpieces using aqueous media.

22. A system for cleaning workpieces and sponges, the system comprising:
one or more cleaning stations, each comprising;
one or more sponges having a surface charge and configured for cleaning said workpieces;
a workpiece cleaning fluid;
a sponge cleaning fluid; and
a fluid delivery system configured to deliver said workpiece cleaning fluid to said one or more sponges and to said workpieces, and to deliver said sponge cleaning fluid to said one or more sponges; wherein at least one of said workpiece cleaning fluid and said sponge cleaning fluid includes a sponge charge modifying agent comprising an aliphatic amine configured to change said surface charge of said one or more sponges when said one or more sponges are exposed to said at least one of said workpiece cleaning fluid and said sponge cleaning fluid.

23. The system of claim 22, wherein said fluid delivery system comprises a first fluid delivery apparatus for delivering said workpiece cleaning fluid and a second fluid delivery apparatus for delivering said sponge cleaning fluid.

24. The system of claim 23, wherein said second fluid delivery apparatus further includes a container for removably holding said sponge cleaning fluid and at least one of said one or more sponges.

25. A system for cleaning workpieces and sponges, the system comprising:
one or more cleaning stations, each comprising;
one or more polyvinyl acetate sponges having a surface charge and configured for cleaning said workpieces,
a fluid delivery system,
a workpiece cleaning fluid having a sponge charge modifying agent comprising an aliphatic amine, and
a sponge cleaning fluid, wherein at least one of said workpiece cleaning fluid and said sponge cleaning fluid comprise a sponge charge modifying agent configured to change the surface charge of said one or more sponges.

26. A system for cleaning workpieces and sponges, the system comprising:
one or more cleaning stations, each comprising;
one or more polyvinyl acetate sponges having a surface charge and configured for cleaning said workpieces,
a fluid delivery system,
a workpiece cleaning fluid having a sponge charge modifying agent comprising an aromatic amine, and
a sponge cleaning fluid, wherein at least one of said workpiece cleaning fluid and said sponge cleaning fluid comprise a sponge charge modifying agent configured to change the surface charge of said one or more sponges.

27. A system for cleaning workpieces and sponges, the system comprising:
one or more cleaning stations, each comprising;
one or more polyvinyl acetate sponges having a surface charge and configured for cleaning said workpieces,
a fluid delivery system,
a workpiece cleaning fluid, and
a sponge cleaning fluid having a sponge charge modifying agent comprising an aliphatic amine, wherein at least one of said workpiece cleaning fluid and said sponge cleaning fluid comprise a sponge charge modifying agent configured to change the surface charge of said one or more sponges.

28. A system for cleaning workpieces and sponges, the system comprising:
one or more cleaning stations, each comprising
one or more polyvinyl acetate sponges having a surface charge and configured for cleaning said workpieces,
a fluid delivery system,
a workpiece cleaning fluid, and
a sponge cleaning fluid having a sponge charge modifying agent comprising an aromatic amine, wherein at least one of said workpiece cleaning fluid and said sponge cleaning fluid comprise a sponge charge modifying agent configured to change the surface charge of said one or more sponges.

29. A system for cleaning workpieces and sponges, the system comprising:
one or more cleaning stations, each comprising;
one or more sponges having a surface charge and configured for cleaning said workpieces,
a workpiece cleaning fluid,
a sponge cleaning fluid; and
a fluid delivery system configured to deliver said workpiece cleaning fluid to said one or more sponges and to said workpieces, and to deliver said sponge cleaning fluid to said one or more sponges; wherein at least one of said workpiece cleaning fluid and said sponge cleaning fluid includes a sponge charge modifying agent comprising an aromatic amine configured to change said surface charge of said one or more sponges when said one or more sponges are exposed to said at least one of said workpiece cleaning fluid and said sponge cleaning fluid.

30. The system of claim 29, wherein said fluid delivery system comprises a first fluid delivery apparatus for delivering said workpiece cleaning fluid and a second fluid delivery apparatus for delivering said sponge cleaning fluid.

31. The system of claim 30, wherein said second fluid delivery apparatus further includes a container for removably holding said sponge cleaning fluid and at least one of said one or more sponges.

* * * * *